(12) United States Patent
Aras et al.

(10) Patent No.: US 8,730,075 B2
(45) Date of Patent: May 20, 2014

(54) APPARATUS AND SYSTEM TO SUPPRESS ANALOG FRONT END NOISE INTRODUCED BY CHARGE-PUMP THROUGH EMPLOYMENT OF CHARGE-PUMP SKIPPING

(71) Applicant: Texas Instruments Incorporated, Dallas, TX (US)

(72) Inventors: Sualp Aras, Dallas, TX (US); Guhaprakash Amudhan, Richardson, TX (US); Abidur Rahman, Allen, TX (US); Xiaochun Zhao, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/782,902

(22) Filed: Mar. 1, 2013

(65) Prior Publication Data
US 2013/0176155 A1    Jul. 11, 2013

Related U.S. Application Data

(63) Continuation-in-part of application No. 12/986,038, filed on Jan. 6, 2011, now Pat. No. 8,593,317.

(51) Int. Cl.
| | |
|---|---|
| *H03M 1/00* | (2006.01) |
| *H03M 1/12* | (2006.01) |
| *H04N 5/335* | (2011.01) |
| *H04N 3/14* | (2006.01) |
| *G11C 27/02* | (2006.01) |
| *H02M 3/07* | (2006.01) |
| *H03L 7/18* | (2006.01) |

(52) U.S. Cl.
CPC . *H03M 1/00* (2013.01); *H03M 1/12* (2013.01); *H04N 5/335* (2013.01); *H04N 3/155* (2013.01); *G11C 27/026* (2013.01); *H02M 3/07* (2013.01); *H03L 7/18* (2013.01)
USPC .......................................... 341/122; 341/155

(58) Field of Classification Search
CPC .......... H03M 1/00; H03M 1/12; H04N 5/335; H04N 3/155; G11C 27/026; H02M 3/07; H03L 7/18
USPC ............. 341/122, 155; 348/308, 294; 327/94, 327/589, 156, 147, 148
See application file for complete search history.

(56) References Cited

U.S. PATENT DOCUMENTS 6,150,879 A * 11/2000 Watanabe ..................... 327/589

OTHER PUBLICATIONS

"Sim_toplevel_LED00," as understood by Applicant, a product having elements corresponding to the figures were "sampled" (e.g., offered to sale to a customer on Dec. 18, 2009 (Aras, et al.).

*Primary Examiner* — Joseph Lauture
(74) *Attorney, Agent, or Firm* — Alan A. R. Cooper; W. James Brady, III; Frederick J. Telecky, Jr.

(57) ABSTRACT

An apparatus, comprising: a charge-pump; a sampler that samples an optical signal, including: a black sampler; a video sampler; and an analog to digital converter. The first aspect further provides a single clock that is coupled to and provides clocking signals to: a) the charge-pump logic that is coupled to the charge-pump; and b) the sampler logic that is coupled to the sampler that samples the optical signal, wherein if the clock for the charge pump is running faster than an analog front end ("AFE") video sampling clock, a state-machine control is configured to: skip the charge pump clock period right before a video sample signal falling edge, thereby recovering to a normal operation the next charge-pump clock period, wherein this duty cycle modulation of charge pump clock will not substantially impact charge pump output.

16 Claims, 8 Drawing Sheets

APPARATUS AND SYSTEM TO SUPPRESS ANALOG FRONT END NOISE INTRODUCED BY CHARGE-PUMP THROUGH EMPLOYMENT OF CHARGE-PUMP SKIPPING

PRIORITY

This application is a continuation-in-part of application Ser. No. 12/986,038, filed Jan. 6, 2011, entitled "APPARATUS AND SYSTEM TO SUPPRESS ANALOG FRONT END NOISE INTRODUCED BY CHARGE-PUMP"

TECHNICAL FIELD

This application is directed, in general, to noise suppression in an analog front-end ("AFE"), and, more specifically, to noise suppression introduced by a clock of a charge-pump in an AFE.

BACKGROUND

A Charge-pump can provide a high rise/fall rate (such as approximately 3.3 Volts/nanosecond) rail-to-rail clock signals to drive external capacitors of various circuit components. In conventional systems, an aggressive ground and shield design strategy may be preferred on a printed circuit board ("PCB") to avoid charge-pump clock switching noise getting electrically coupled to other sensitive sensor inputs, especially through a phenomenon known as "ground bounce," and other forms of electromagnetic discharge. Ground bounce is especially problematic for video inputs, reset level clamps ("RLCs"), and analog to digital converter ("ADC") reference pins.

However, as a countervailing consideration, cost-driven PCB design, such as for a "scan-head" with a coupled charge-pump may employ a single ground plane. This typically has hampered performance, due to such considerations as PCB and circuit geometry limitations. Thus, even though the charge-pump may be internally physically isolated from the sensitive analog circuits on a die, switching noise of the charge-pump could easily deteriorate a signal-to-noise ratio ("SNR") of the AFE due to such factors as external electrical coupling through ground bounce.

In one initial implementation, it was found that the SNR of an AFE deteriorated from 62 dB to 40 dB, when a Charge-pump was enabled. Further investigation, which involved varying the AFE sampled rate, revealed that noise on conversion data of the ADC is an inter-modulation product between the charge-pump clock and a sampled frequency of the AFE. This conclusion has also been supported by observing that charge-pump clock edges have been variously coupled to video inputs, RLC signals, and AFE reference signals.

One approach to decrease noise of a charge-pump is to increase a rise/fall time of the Charge-pump, such as from 1 nanosecond ("ns") to 3 ns. This increase has not been found to provide a significant improvement on the SNR. Moreover, a further increase is not practically possible on a die, since a minimum clock rise/fall time is dictated by efficiency and shoot-through concerns of the charge-pump.

Therefore, there is a need in the art for a noise suppression in an AFE that employs a charge-pump that addresses at least some issues discussed above associated with the AFE and charge-pump.

SUMMARY

A first aspect provides an apparatus, comprising: a charge-pump; a sampler that samples an optical signal, including: a black sampler; a video sampler; and an analog to digital converter. The first aspect further provides a single clock that is coupled to and provides clocking signals to: a) the charge-pump logic that is coupled to the charge-pump; and b) the sampler logic that is coupled to the sampler that samples the optical signal. In the first aspect: i) said first clock signal rises three clock cycles before said second clock signal rises; ii) said second clock signal is high for seventeen clock cycles; iii) said second clock signal falls five clock cycles before said first clock train signal falls; and iv) said first clock signal is low for seventeen clock cycles, wherein if the clock for the charge pump is running faster than an analog front end ("AFE") video sampling clock, a state-machine control is configured to: skip the charge pump clock period right before a video sample signal falling edge, thereby recovering to a normal operation the next charge-pump clock period, wherein this duty cycle modulation of charge pump clock will not substantially impact charge pump output.

A second aspect provides a system, comprising: a charge-pump having: a first gate of a first switch, a second gate of a second switch; a third gate of a third switch; and a fourth fate of a fourth switch. The second aspect further provides a sampler that samples an optical signal, including: a black sampler; a video sampler; and an analog to digital convertor. A single clock is coupled to: a) the first gate by a first clock signal line, the second gate by a second clock signal line, the third gate by a third clock signal line; and the fourth gate by a fourth clock signal line; and b) the sampler that samples the optical signal. A rising edge of a first clock signal of the first clock signal line and falling edge of a second clock signal of the second clock signal line are each aligned to a falling edge of an analog to digital clock signal of an ADC line coupled to the ADC, wherein if the clock for the charge pump is running faster than an analog front end ("AFE") video sampling clock, a state-machine control is configured to: skip the charge pump clock period right before a video sample signal falling edge, thereby recovering to a normal operation the next charge-pump clock period, wherein this duty cycle modulation of charge pump clock will not substantially impact charge pump output.

A third aspect provides a system, comprising: a charge-pump having: a first gate of a first switch; a second gate of a second switch; a third gate of a third switch; and a fourth gate of a fourth switch. A sampler is provided for sampling an optical light sensor, including: a black sampler; a video sampler; and an analog to digital convertor. A single clock is coupled to: a) a charge-pump logic coupled to: the first gate by a first clock line; the second gate by a second clock line; the third gate coupled by a third clock line; and the fourth gate by a fourth clock line; b) the sampler; and c) the ADC. A falling edge of a first clock signal of the first clock line; and a rising edge of a second clock signal of the second clock line are both aligned with a rising edge of a video sample clock signal, wherein if the clock for the charge pump is running faster than an analog front end ("AFE") video sampling clock, a state-machine control is configured to: skip the charge pump clock period right before a video sample signal falling edge, thereby recovering to a normal operation the next charge-pump clock period, wherein this duty cycle modulation of charge pump clock will not substantially impact charge pump output.

BRIEF DESCRIPTION OF THE DRAWINGS

Reference is now made to the following descriptions taken in conjunction with the accompanying drawings, in which.

DETAILED DESCRIPTION

Figure 1:
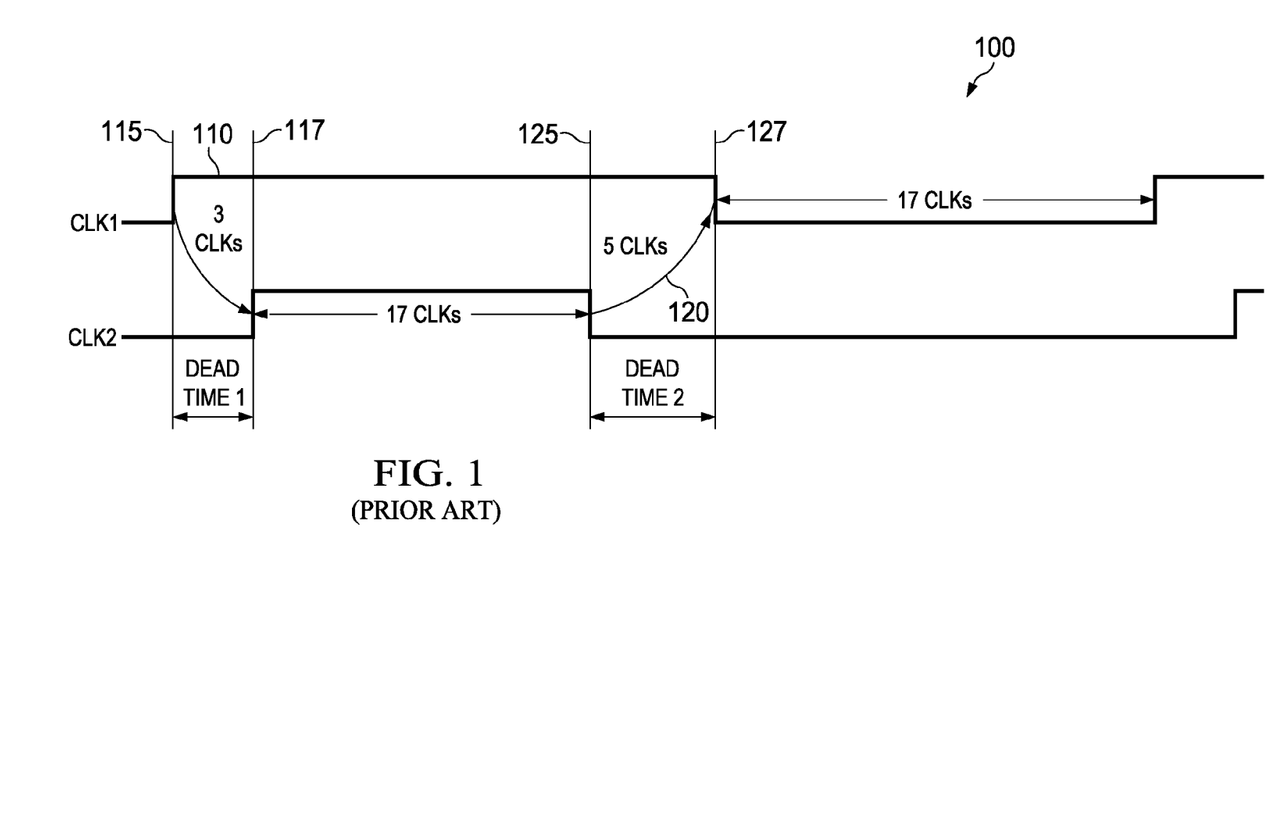
FIG. 1 is a timing diagram of prior art overlapping charge-pump signals.

Turning to FIG. 1, illustrated is a timing diagram 100 of a plurality of prior art overlapping charge-pump clock signals for a charge-pump. The charge-pump can be governed by two overlapping charge-pump clock signals, as illustrated in FIG. 1.

As illustrated in FIG. 1, in one embodiment, during operation there are two dead-times per cycle for a charge-pump: a first dead time 110 and a second dead time 120. The first dead time 110, in which CLK1 is high and CLK2 is low, is three clock cycles from the rising edge of CLK1 115 to rising edge of CLK2 117, and the second dead time 120, in which CLK1 is high and CLK2 is low, is five clock cycles from the falling edge of CLK2 125 to the falling edge of CLK1 127. These prior art clock signals are continuous once the charge-pump is fully enabled, and stay enabled until the charge-pump is disabled.

Figure 2:
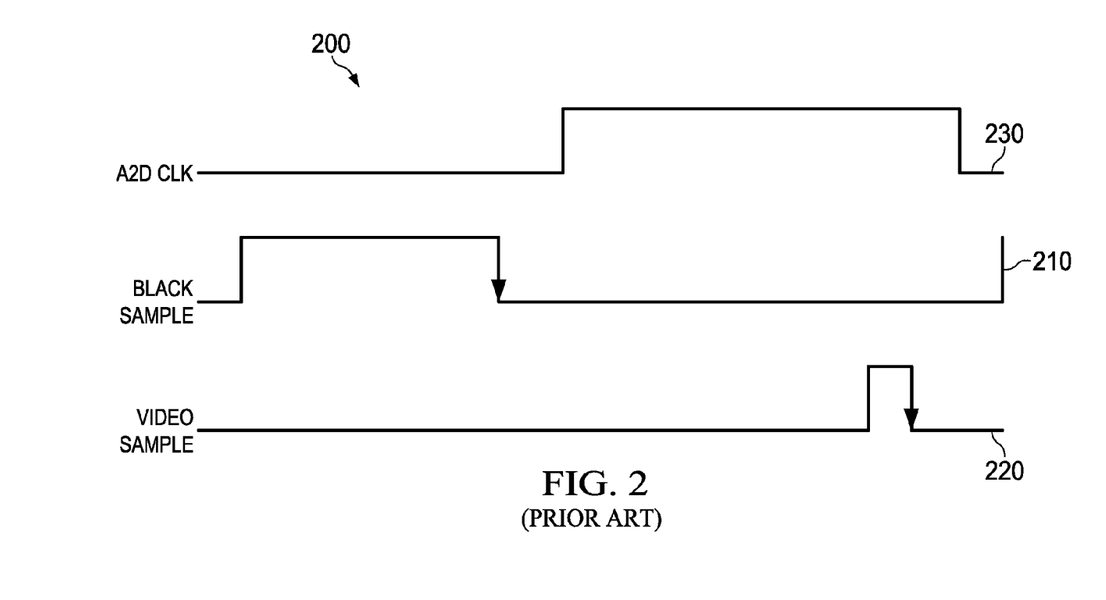
FIG. 2 is a timing diagram of prior art AFE correlated double sampling signals.

Turning to FIG. 2, illustrated is a timing diagram 200 of prior art AFE correlated double sampling signals. A prior art AFE uses an AFE state machine (not illustrated) to control three clock signals: a black sample clock signal 210, a video sample clock signal 220, and an ADF sample clock signal 230. The black sample clock signal 210 and the video sample clock signal 220 are used for correlated double sampling ("CDS") of a given optical signal.

Figure 3A:
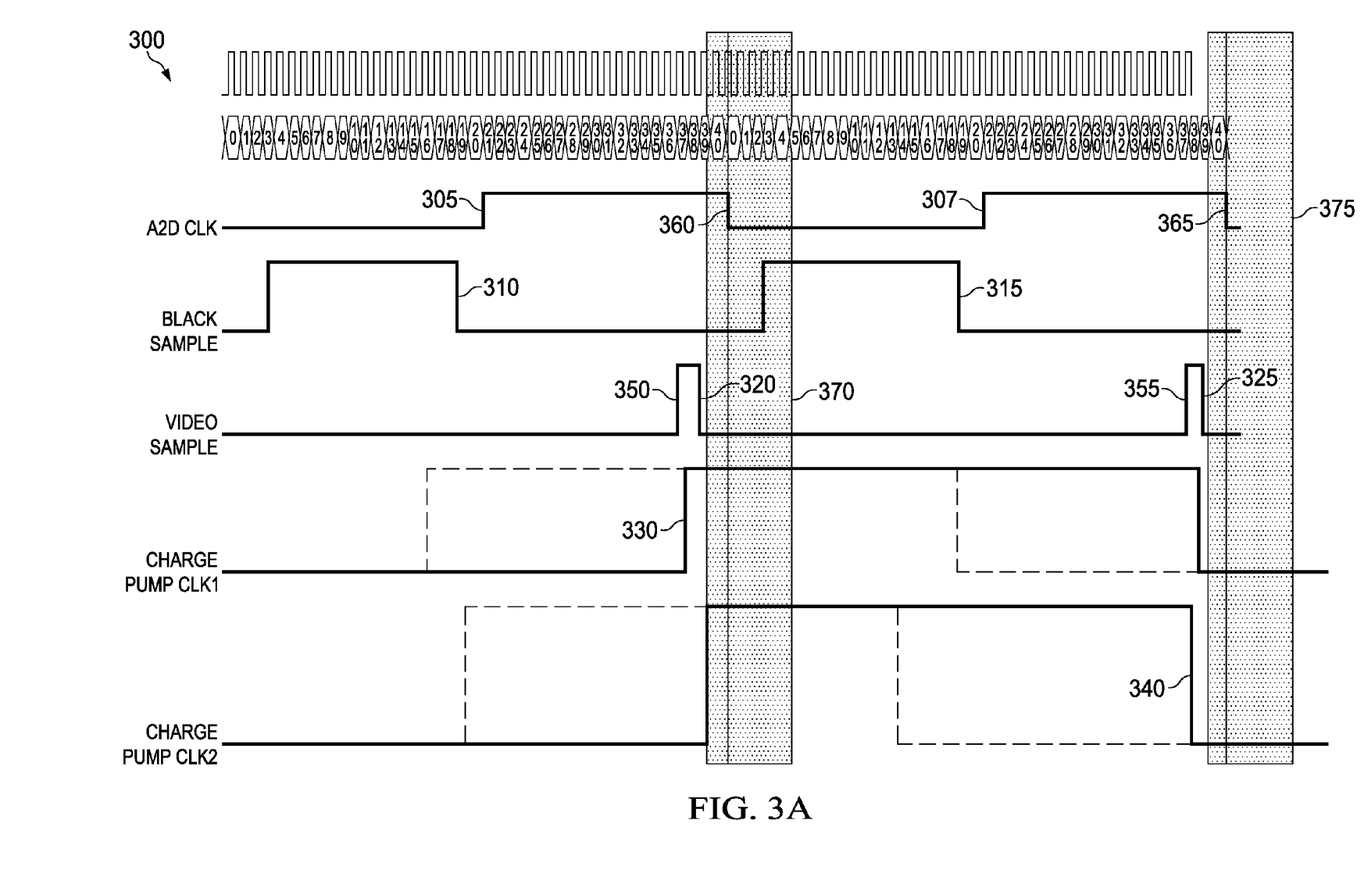
FIG. 3A is a timing diagram of an alignment of a charge-pump clock with a rising edge of a video sample according to a first aspect.

Turning to FIG. 3A, illustrated is a timing diagram 300 of an alignment of a charge-pump clock with a rising edge of a video sample according to a first aspect.

In the timing diagram 300, a falling edge of a black sample clock signal 310 and a falling edge of a video sample clock signal 320, 325 are used to sample a difference between a black signal level and video signal level, with employment of CCD sampling. This difference is applied to an ADC (not illustrated) as an analog input signal, and digital conversion data is then generated. In the timing diagram 300, for a purpose of improving AFE performance, the timing is such that switching noise from a charge-pump is suppressed on a reading of sampled optical signals, especially a reading on or close to the falling edge of black sample clock signal 310 and the video sample clock signal 320, 325.

Figure 3B:
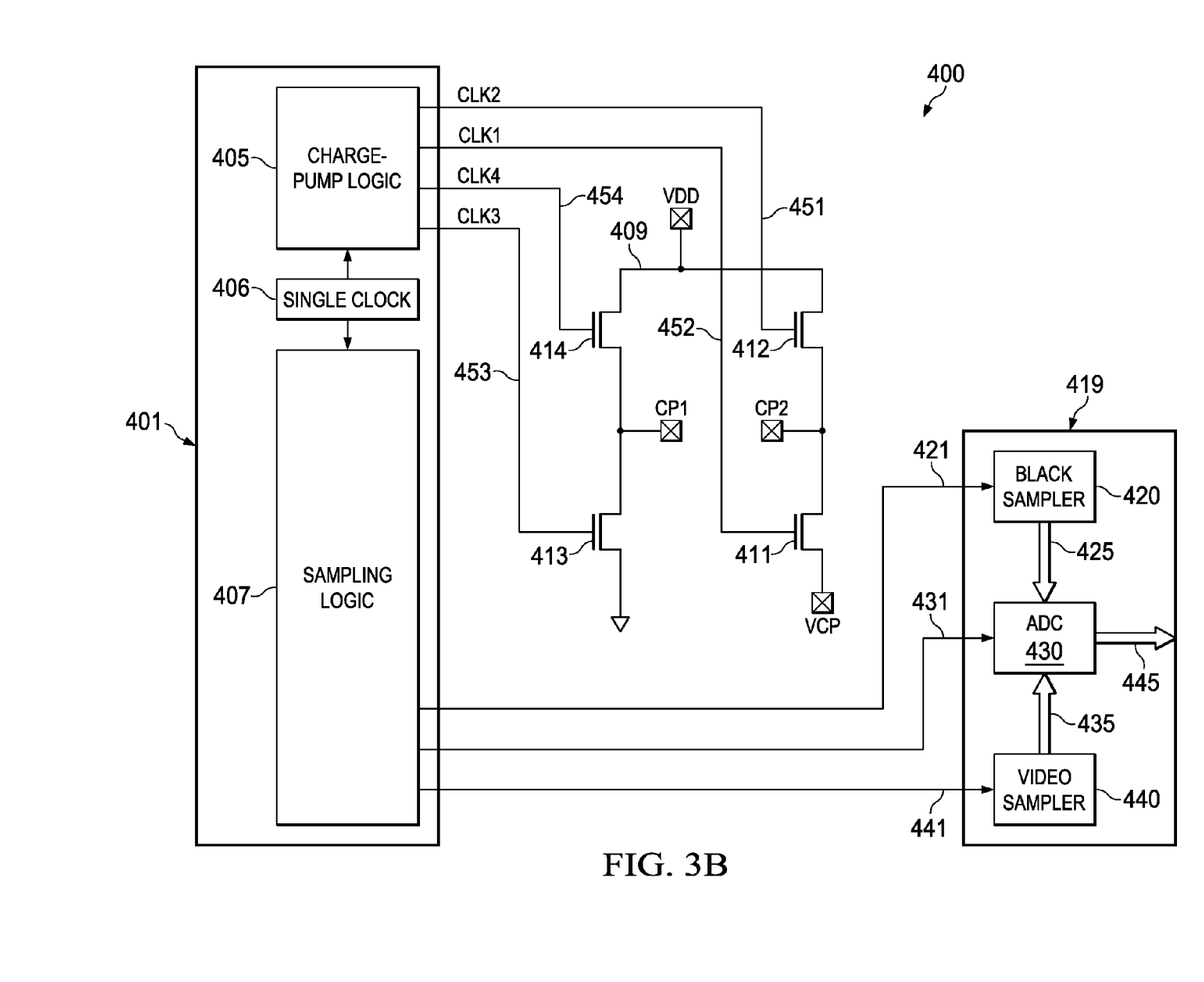
FIG. 3B is an illustration of a system including a single clock driver logic coupled to a charge-pump and a black sampler, video sampler, and ADC according to the first embodiment.

In the timing diagram 300, an analog-to-digital conversion occurs upon a rising edge of an analog to digital clock signal ("AD2CLK") 305, 307. The rising edge of a A2DCLK 305, 307 occurs a plurality of clock cycles after the falling edge of a black sample 310, 315. Also, a falling edge of a video sample clock signal 320, 325 occurs a plurality of clock cycles before a falling edge of A2DCLK 360, 365, as shown in FIG. 3B. After the falling edge of the black sample 310, 315 occurs, an ADC performs analog-to-digital conversion as triggered by the rising edge of the A2DCLK 305, 307. A first sampling state machine, such as embodied in a sampling logic 405 of the system 400, to be discussed below, can implement and generate the black sampling signals, AD2CLKs, and the video sampling signals of the timing diagram 300.

In a further embodiment, a rising edge of clock one signal ("CLK1") 330 and a falling edge of clock two signal ("CLK2") 340 are aligned to the rising edge of the video sample clock signal 350, 355, respectively. Note that in some implementations, "alignment" can be define as that one clock cycle has occurred between transitions of edges of aligned clock signals. In one embodiment, a charge-pump clock state machine, such as a state machine 500 of FIG. 3C, to be discussed below, is employed in tandem with a first sampling state machine which implements the charge-pump clock signals of the timing diagram 300.

Implementation of the timing diagram 300 can be advantageous, in that it provides a substantial width of a black sample that is significant for a black level clamping accuracy. The timing diagram 300 can provide a wide range of programmability for the falling edge of black sample clock signal 310.

Regions 370, 375, marked in grey, indicate experimentally-observed periods of time in which the sensitive signals ring due to charge-pump switching. During these periods, black sampling and video sampling should be restricted. A possible draw-back of this restriction is that, in one embodiment, a video sample is not wider than two clock cycles. However, in a typical AFE implementation, the falling edge of video clock signal 320 is of more significance regarding video signal sampling than the rising edge of the video clock signal 350. Generally, an implementation of the first timing diagram 300 helps to help suppress front-end noise of an AFE, such as may be used in the system 400.

Figure 4:
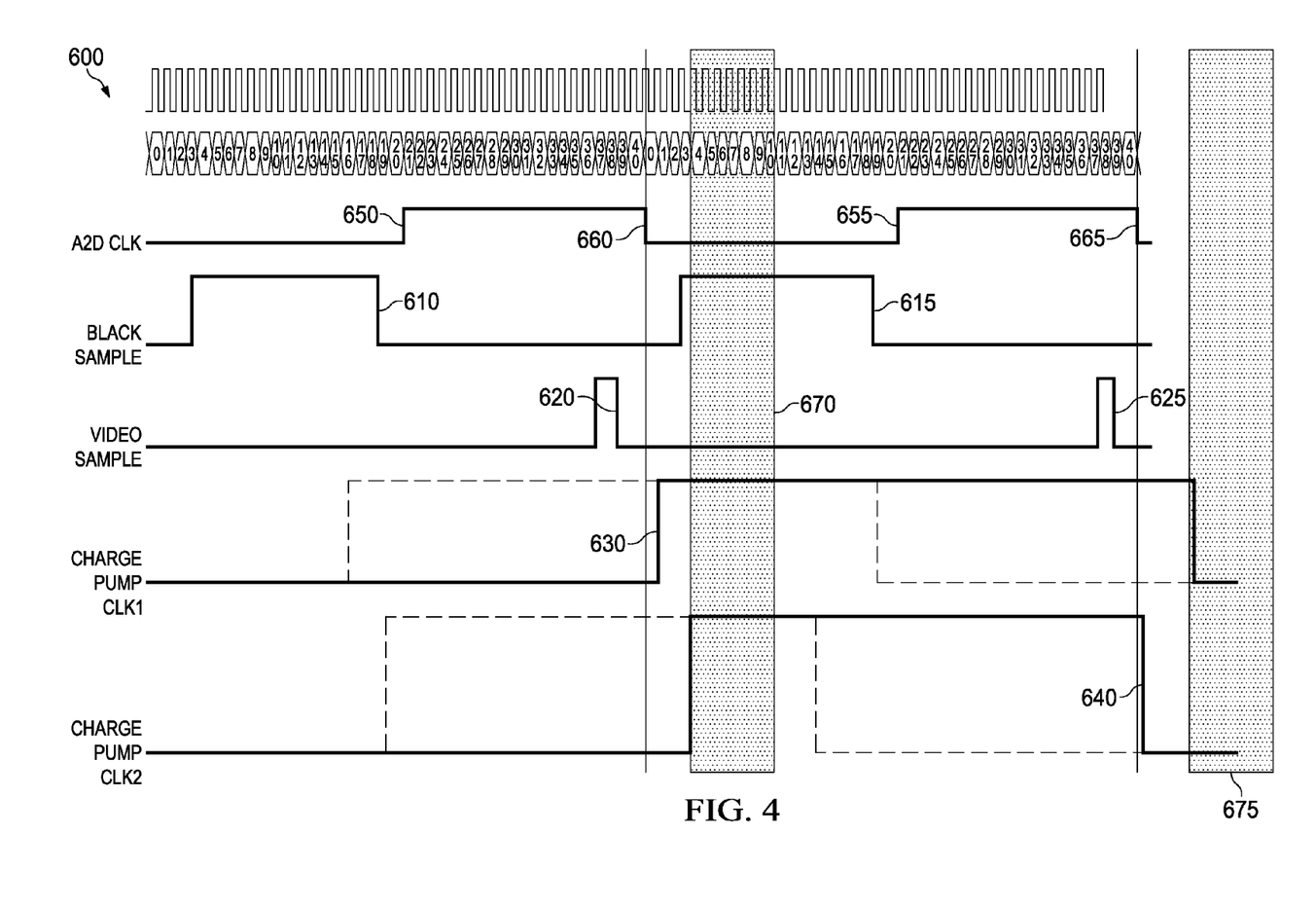
FIG. 4 is a timing diagram of an alignment of a charge-pump clock with a falling edge of an ADC clock signal according to a second aspect.

Turning to FIG. 3B, illustrated is system 400 wherein a charge-pump 409 shares a single clock 406 of a driver logic 401 with a sampler 419. Elements of the system 400 can all share a common electrical ground, and can be coupled to or integrated within a single chip. In one embodiment, the system 400 is an AFE. For ease of explanation, the system 400 is discussed as being used in combination with the first timing diagram 400. However, the system 400 can also be used in combination with the second timing diagram 600.

In the system 400, the driver logic 401 includes a charge-pump logic 405, the single clock 406, and a sampling logic 407. The charge-pump logic 405 is coupled to the charge-pump 409, and the sampling logic 407 is coupled to the sampler 419. The single clock 406 provides clocking signals for both the charge-pump logic 405 and the sampling logic 407, which in turn provide clock signals for other components of the system 400.

In the circuit 400, the sampling logic 407 is coupled a by a black sample clock line 421 to the black sampler 420 of the sampler 419, which can be a sampling circuit. The sampling logic 407 is also coupled by an ADC clock line 431 to the ADC 430 of the sampler 419. The sampling logic 407 is also coupled by a video clock line 441 to the video sampler 440 of the sampler 419.

The black sampler 420 is coupled to the ADC 430 by a bus 425. The video sampler 440 is coupled to the ADC 420 by a bus 435. The ADC 430 of the sampler 419 has an output bus 445.

The charge-pump logic 405 is coupled via a first clock line 451 to a first gate of a first field effect transistor ("FET") 411.

The charge-pump logic 405 is coupled via a second clock line 452 to a second gate of a second FET 412. The charge-pump logic 405 is coupled via a third clock line 443 to a third gate of a third field FET 413. The charge-pump logic 405 is coupled via a fourth clock line 444 to a fourth gate of a fourth FET 414.

In one embodiment, the system 400 includes a Scan-head AFE. The charge-pump 409 is coupled via a ground to the sampler 419, and the charge-pump 409 is also used to drive light emitting diodes ("LEDs") of the system 400 (not illustrated).

In a further embodiment, a scan-head AFE of the system 400 includes: a correlated double sampling programmable gate array ("CDS-PGA"), such as may be used in or in conjunction with the black sampler 420 and the video sampler 440; the ADC 430, such as a 16-bit Pipeline ADC; a red-green blue ("RGB") LED driver (not illustrated); the charge-pump 409, which can be a voltage-doubler; and the driver logic 410. A sampling rate of the scan-head AFE of the system 400 can be programmable between 1-4 mega-samples per second ("MSPS") to support various scanner systems.

One operation of the system 400 can be explained with the timing diagram 300, as will be described below. Both the charge-pump logic 405 and the sampling logic 407 of the driver logic 410 generate the various clock signals employed by the timing diagram 400.

The black sample clock line 421 carries a black sample clock, which includes the falling edge of the black sample 310. The ADC clock line 431 carries the AD2CLK 303. Video sample line 441 conveys a video sample clock signal, which includes the falling video edge clock signal 320, 325 and the rising video edge clock signal 350, 355.

After a start-up of charge-pump 409 has completed, a third clock signal ("CLK3") of the third line 443 has the same clock pattern timing as the CLK1 signal of the first line 441, and a fourth clock signal ("CLK4") of the fourth line 444 has a same signal pattern as the CLK2 signal of second line 442.

In a further embodiment, the system 400 can seamlessly switch clock employed by the charge-pump 409 between a default "system" clock (not illustrated), when the sampler 419 is not activated, and the single clock 406, for driving circuit 400. The charge-pump 409 initially derives its clock signal from a system clock (not illustrated) when aspects of the AFE, such as the sampler 419, are not running. The charge-pump 409 then switches to the single clock 406 of driver logic 410 whenever an AFE sampling is enabled. As a result of this arrangement, an efficiency of the charge-pump 409 is increased due to more efficient use of charge-pump dead cycle, as discussed above.

In one embodiment of the system 400, each edge of the three clock signals for the black sampler 420, the ADC 430, and the video sampler 440, (for a total of six clock signal edge transitions) can be programmed using six 8-bit registers, and the edges are controlled using a first sampling state machine (not illustrated) embodied in the sampling logic 405. The first sampling state machine can be physically independent from the charge-pump state machine, although there can be timing relations amongst individual outputs of the state engines, such as CLK1 and CLK2 signals, black sample signals and video sample signals. In one embodiment, a start of ADC conversions by the ADC converter 430 is determined by a state machine, such as the charge-pump state machine or the first sampling state machine, of the logic 410, which is in turn triggered by a signal on one of the input pins to the logic 410.

In one embodiment of the system 400 when employing various state machines implementing the timing diagram 300, a video sample is not wider than two clock cycles of the single clock 406. However, it is typically the falling edge of the video signal that is significant regarding video signal sampling.

Figure 3C:
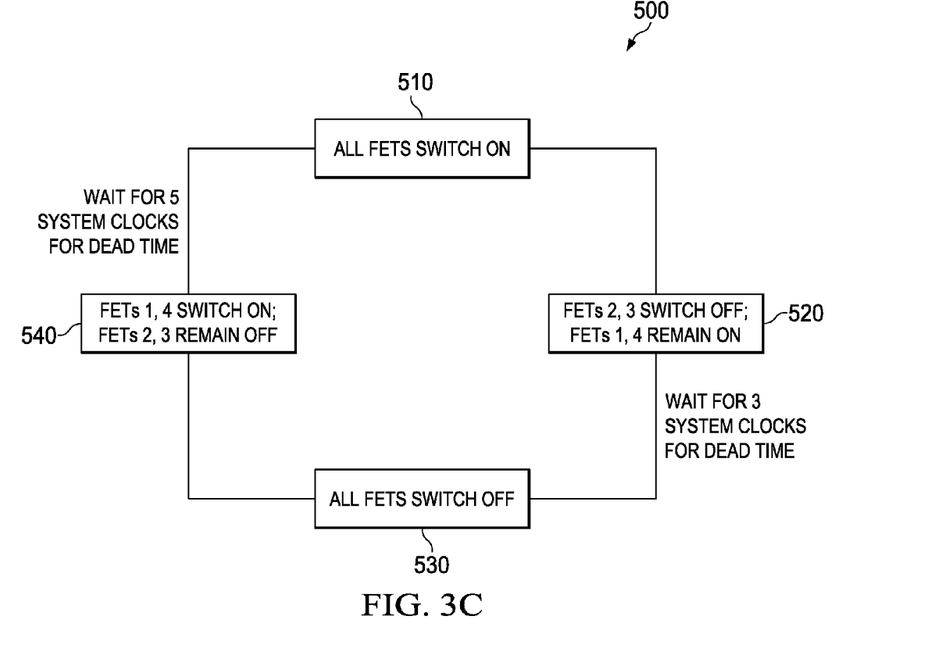
FIG. 3C is an illustration of a charge-pump state machine for use with a charge-pump logic of FIG. 3B.

Turning now to FIG. 3C, illustrated is one embodiment of the state machine 500 to be used with clock signals applied to the gates of the FETs of the charge-pump 409 of the system 400, as discussed above. The state machine 510 and the first sampling state machine for the black simpler 420, the ADC 430 and the video sampler 440 are all clocked by a single clock, such as the single clock 406 of the system 400. In the state machine 500, after a start-up of the system 400 has finished, FET 3 413 behaves like FET 2 412, and FET 4 414 behaves like FET 1 411.

The state machine 500 may be embodied within the charge-pump logic 405.

In a start state 510, all FETs, FET 1 411, FET 2 412, FET 3 413, FET 4 414 are on. Then the state machine 500 transitions to a state 520.

In state 520, FET 2 412 and FET 3 413 switch off. FET 1 411 and FET 4 414 remain on. Then, the state machine 500 waits for three clock cycles, and then the state machine 500 advances to a state 530.

In state 530, all FETs 1 411, FET 2 412, FET 3 413, and FET 4 414 are off. The state machine 500 transitions to a state 540.

In state 540, FET 1 411 and FET 4 414 are on. FETs 2 412 and FET 3 413 remain off. Then, the state machine 500 waits for 5 clock cycles. The state machine 500 then advances in a circular manner back to state 510.

Turning to FIG. 4, illustrated is a second aspect of a timing diagram 600, such as can also be used with employment of the system 400 and can also be implemented in the logic 410. In the timing diagram 600, analogous to the timing diagram 300, a falling edge of a black sample clock signal 610, 615 and a falling edge of a video sample clock signal 620, 625 are used to sample a difference on an optical input signal between black signal levels and video signal levels, with employment of CCD sampling. This difference is applied to an ADC (not illustrated) as an analog input signal, and digital conversion data is then generated. An analog-to-digital conversion occurs upon a rising edge of an AD2CLK 650, 655.

In the timing diagram 600, the rising edge of the A2DCLK 650, 655 occurs a plurality of clock cycles after the falling edge of the black sample clock signals 610, 615. Also, falling edge of the video sample clock signals 620, 625 occurs a plurality of clock cycles before a falling edge of A2DCLK 660, 665, as shown in FIG. 4. After the falling edge of the black sample clock signals 610, 615 occurs, an ADC performs analog-to-digital conversion on the rising edge of the A2DCLK 650, 655. In one embodiment, a second sampling state machine embodied in the sampling logic 405 can implement and generate the black sample clock signals, video sample clock signals, and the AD2CLK of the timing diagram 600.

In a further preferred embodiment, the charge-pump clocks, CLK1 and CLK2, are also aligned with the falling edge of the A2DCLK 660, 665. In this further preferred embodiment, regarding the falling edge of the A2DCLK 660, 665, a CLK1 and CLK2 pattern follows, still maintaining a three and five clock cycle dead-time periods. In the timing diagram 600, a rising edge of CLK1 630 and a falling edge of CLK2 640 are aligned to the falling edge of the A2DCLK signals 660, 665, respectively. Note that in some implementations, "alignment" can be defined as that one clock cycle has occurred between aligned edges of different clock signals.

A charge-pump clock state machine, such as the state machine 500, can be employed by the system 400 to generate CLK1 and CLK2. The second sampling state machine can be employed by the system 400 to implement the timing diagram 600 and generate the black sample clock signal, the video sample clock signal, and the ADC clock signal.

Regions 670, 675 marked in grey indicate experimentally-observed periods of time for the second aspect in which the sensitive signals ring due to charge-pump switching. During these periods, black sampling and video sampling should be restricted. A possible draw-back of this restriction is a somewhat limited range of black sample locations available for AFE performance.

Figure 5:
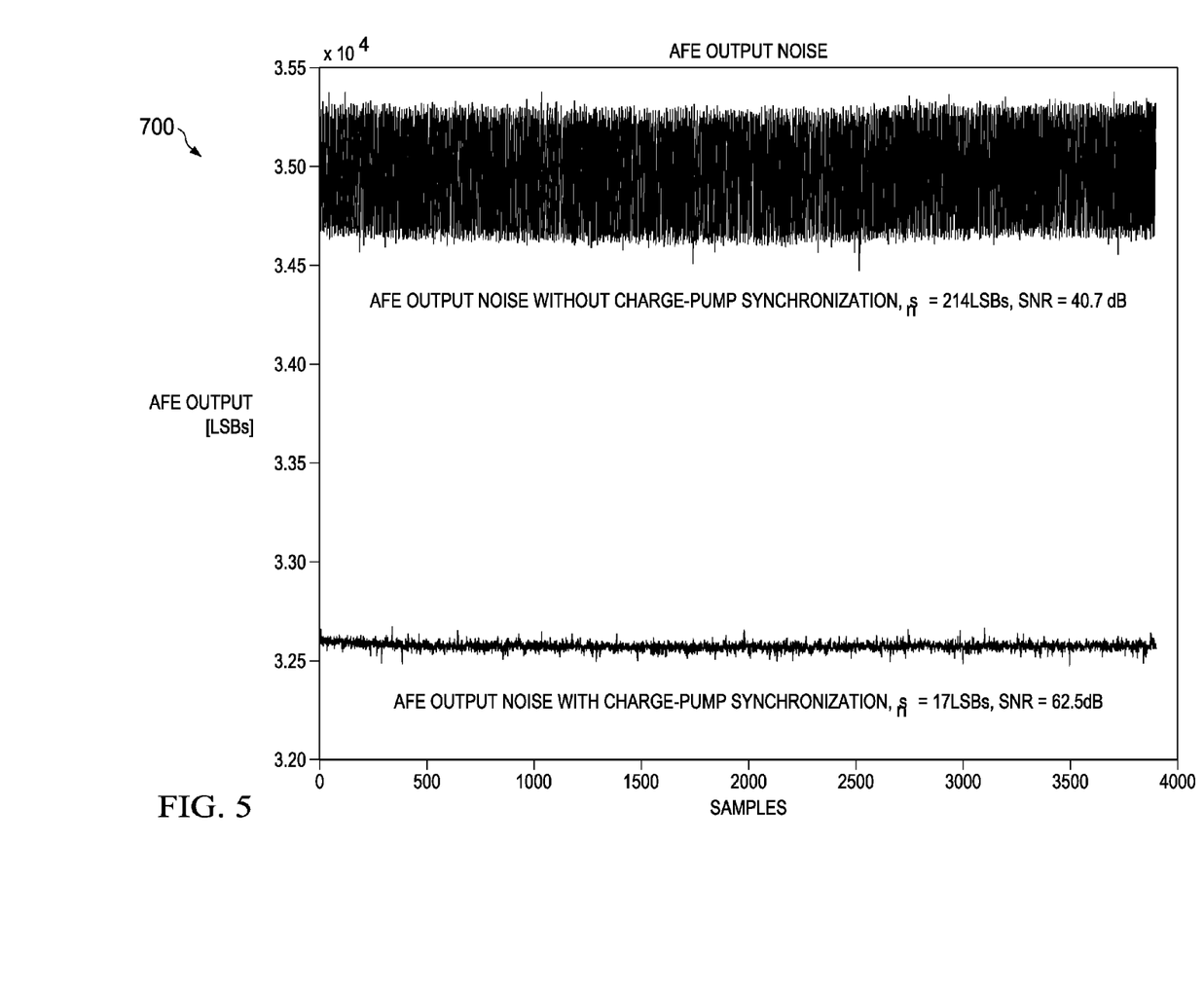
FIG. 5 is a graph of an AFE noise performance with and without a single logic to drive both the charge-pump and the AFE.

Turning now to FIG. 5, illustrated is an AFE noise performance 700 with employment of a single clock domain 710 and without employment of a single clock domain 720. Noise measurement results reveal that the SNR performance of the AFE has improved to 62 dB from 40 dB, even while the charge-pump is enabled. The noise performance of the AFE with charge-pump single clock is as effectively as of high of quality as the SNR that occurs while the charge-pump is completely disabled.

Figure 6:
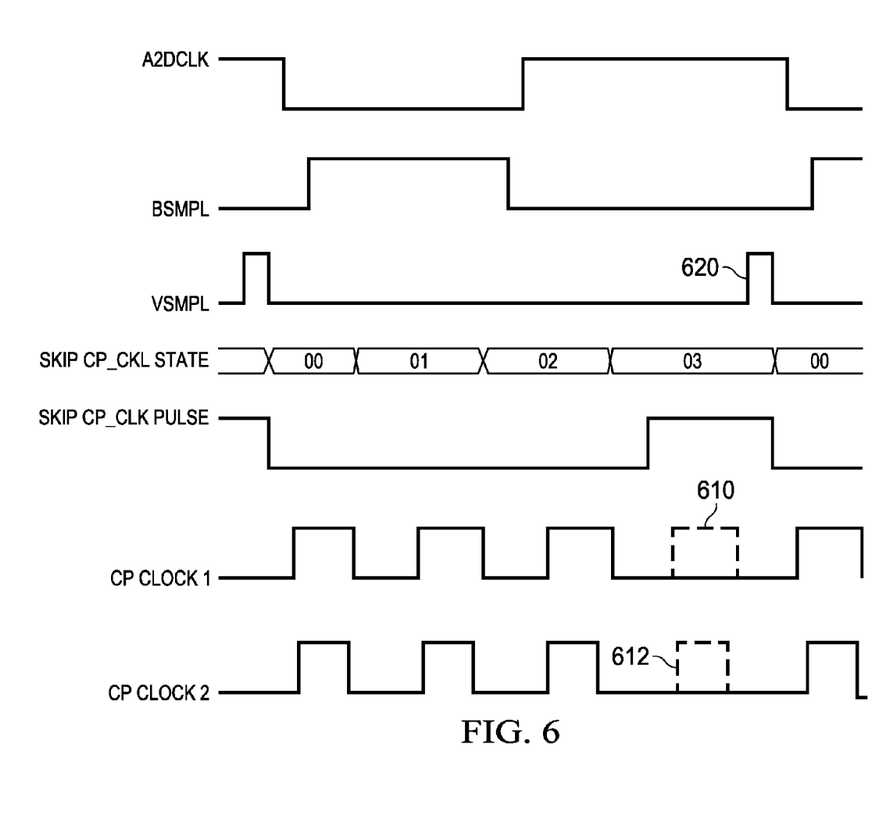
FIG. 6 is a graph of a skipping of a Charge-Pump clock period that coincides with the VIDEO Sample pulse.

Turning to FIG. 6, illustrated is a graph of a skipping of a Charge-Pump clock period 610, 612 that coincides with the VIDEO Sample pulse 620.

In generalized conditions that involve Charge-Pump clock running significantly faster than ADC clock, e.g., 4× or higher, it is optimal to skip the Charge-Pump clock period that coincides with the VIDEO Sample pulse;

A Charge-Pump clock state-machine can be implemented, such as an alternative embodiment as illustrated in FIG. 3C, such that, the falling edge of VIDEO Sample pulse resets the state to 00, and following CP-CLOCK1 falling edge increments it.

Once the state reaches to CP-CLOCK1 period prior to the next VIDEO Sample pulse, a "SKIP CP-CLOCK signal" can be set to mask the CP-CLOCK1 and CP-CLOCK2 signals, so that Charge-Pump switching is skipped prior to VIDEO Sample Pulse.

Since Charge-Pump switching prior to Video sampling will introduce significant noise injection, this skipping scheme will provide optimal noise performance, combined with Charge-pump clock edges phase aligned to A2DCLK/VIDEO Sample Pulse.

Those skilled in the art to which this application relates will appreciate that other and further additions, deletions, substitutions and modifications may be made to the described embodiments.

What is claimed is:

1. An apparatus, comprising:
   a charge-pump;
   a sampler that samples an optical signal, including:
      a black sampler that samples ambient noise when a video signal is not being applied;
      a video sampler; and
      an analog to digital converter ("ADC"); and
   a single clock that is coupled to and provides clocking signals to:
      a) a charge-pump logic that is coupled to said charge-pump; and
      b) a sampler logic that is coupled to said sampler that samples said optical signal, wherein
         i) said first clock signal rises three clock cycles before said second clock signal rises;
         ii) said second clock signal is high for seventeen clock cycles;
         iii) said second clock signal falls five clock cycles before said first clock train signal falls; and
         iv) said first clock signal is low for seventeen clock cycles, then rises,
      wherein if the clock for the charge pump is running faster than an analog front end ("AFE") video sampling clock, a state-machine control is configured to:
         skip the charge pump clock period right before a video sample signal falling edge, thereby recovering to a normal operation the next charge-pump clock period,
         wherein this duty cycle modulation of charge pump clock will not substantially impact charge pump output.

2. The system of claim 1, wherein said single clock, said charge-pump logic, said charge-pump, said sampler logic, and said sampler that samples said optical signal are integrated within a single chip and share a common electrical ground.

3. The system of claim 1, wherein said charge-pump is a voltage doubler.

4. The system of claim 1, wherein said sampler that samples said optical signal employs a correlated double sampling which comprises employing said video signal sampler and said black sampler.

5. The system of claim 1, wherein said single clock causes a generation of at least five clock signals:
   a first clock signal to a first gate of said charge-pump from said charge-pump logic;
   a second clock signal to a second gate said charge-pump from said charge-pump logic;
   a black sample clock signal to said black sampler from said sampler logic;
   a video sample clock signal to said video sampler from said sampler logic; and
   an ADC clock signal to said ADC from said sampler logic.

6. The system of claim 5, wherein:
   a) a rising edge of said ADC clock signal occurs a plurality of clock cycles after a falling edge of said black sample clock signal; and
   b) a falling edge of said ADC clock signal occurs a plurality of clock cycles after a falling edge of said video clock signal.

7. The system of claim 6, wherein:
   c) a rising edge of said first clock signal is aligned with a rising edge of said video clock signal; and
   d) a falling edge of said second clock signal is aligned with said rising edge of said video clock signal.

8. The system of claim 1, wherein
   a) said first clock signal rises three clock cycles before said second clock signal rises;
   b) said second clock signal is high for seventeen clock cycles;
   c) said second clock signal falls five clock cycles before said first clock train signal falls;
   d) said first clock signal is low for seventeen clock cycles, then rises.

9. The system of claim 1, wherein said sampler that samples said optical signal employs a correlated double sampling which comprises employing said black sampler and said video sampler.

10. A system, comprising:
    a charge-pump having:
       a first gate of a first switch;
       a second gate of a second switch;
       a third gate of a third switch; and
       a fourth gate of a fourth switch;
    a sampler that samples an optical signal, including:
       a black sampler that samples ambient noise when a video signal is not being applied;

a video sampler; and
an analog to digital convertor ("ADC");
a single clock coupled to:
   a) a charge-pump logic that is coupled to:
      said first gate by a first clock signal line;
      said second gate by a second clock signal line,
      said third gate coupled by a third clock signal line; and
      said fourth gate coupled by a fourth clock signal line; and
   b) a sampling logic that is coupled to said sampler; and
wherein if the clock for the charge pump is running faster than an analog front end ("AFE") video sampling clock, a state-machine control is configured to:
skip the charge pump clock period right before a video sample signal falling edge, thereby recovering to a normal operation the next charge-pump clock period,
wherein this duty cycle modulation of charge pump clock will not substantially impact charge pump output.

11. The system of claim 10, wherein: said single clock; said sampling logic, said sampler; said charge-pump logic and said charge-pump are integrated within a single chip and share a common electrical ground.

12. The system of claim 10, wherein said charge-pump is a voltage doubler.

13. The system of claim 10, wherein said sampler employs a correlated double sampling which employs said black sampler and said video sampler.

14. The system of claim 10, wherein an analog to digital conversion of said ADC is triggered by a rising edge of said analog to digital clock signal.

15. The system of claim 10, wherein:
   said rising edge of said analog to digital clock signal occurs a plurality of clock cycles after a falling edge of a black sample clock signal; and
   said rising edge of said analog to digital clock signal occurs a plurality of clock cycles after a falling edge of a video sample clock signal.

16. The system of claim 10, wherein said first clock signal and a third clock signal on said third clock line are a same clock signal, and said third clock signal and a fourth clock signal on said fourth clock line are a same clock signal.

* * * * *